United States Patent [19]
Nakasuji

[11] Patent Number: 6,117,600
[45] Date of Patent: Sep. 12, 2000

[54] CHARGED-PARTICLE-BEAM TRANSFER METHODS UTILIZING HIGH AND LOW RESOLUTION SUB-PATTERNS

[75] Inventor: Mamoru Nakasuji, Yokohama, Japan

[73] Assignee: Nikon Corporation, Tokyo, Japan

[21] Appl. No.: 09/229,480

[22] Filed: Jan. 13, 1999

[30] Foreign Application Priority Data

Jan. 14, 1998 [JP] Japan ................... 10-017636

[51] Int. Cl.[7] ........................ G03F 9/00
[52] U.S. Cl. ............... 430/30; 430/296; 430/942
[58] Field of Search ............... 430/30, 296, 942

[56] References Cited

U.S. PATENT DOCUMENTS 5,260,151  11/1993  Berger et al. ................... 430/5
5,912,096  6/1999   Hada ........................... 430/296
5,935,744  8/1999   Nakajima ....................... 430/296

OTHER PUBLICATIONS

Kratschmer et al., "Resist Heating Effects in 25 and 50 kV e–Beam Lithography on Glass Masks," *J. Vac. Sci. Technol. B.* 8:1898–1902 (Nov./Dec. 1990).

Nakajima et al., "Calculation of a Proximity Resist Heating in Variably Shaped Electron Beam Lithography," *J. Vac. Sci. Technol. B.* 8:2784–2788 (Nov./Dec. 1992).

Nakajima et al., "New Compensation Method for Avoiding Proximity Resist Heating in Variably Shaped Electron Beam Lithography," *J. Vac. Sci. Technol. B.* 8:1437–1440 (Nov./Dec. 1990).

*Primary Examiner*—Christopher G. Young
*Attorney, Agent, or Firm*—Klarquist Sparkman Campbell Leigh & Whinston, LLP

[57] ABSTRACT

Charged-particle-beam pattern-transfer methods, apparatus, and masks are disclosed that reduce the effects of resist-heating, avoid the so-called stencil problem, and exhibit high throughput. A circuit pattern is divided into low-resolution and high-resolution features that are defined by respective mask patterns in different areas of a mask or on different masks. The respective mask patterns are projected overlappingly onto the substrate. In another embodiment, a mask pattern defines low-resolution circuit features and a portion of high-resolution features. A second mask pattern defines a substantial portion of the high-resolution circuit features. The first and second mask patterns are projected onto the substrate with the charged-particle beam at first and second doses. The first dose, corresponding to the low-resolution circuit features, is larger than the second dose, and the first and second doses are independently selectable.

20 Claims, 6 Drawing Sheets

CHARGED-PARTICLE-BEAM TRANSFER METHODS UTILIZING HIGH AND LOW RESOLUTION SUB-PATTERNS

FIELD OF THE INVENTION

The invention pertains to methods and apparatus for charged-particle-beam pattern transfer for transferring patterns defined by a mask onto a sensitized wafer or other substrate.

BACKGROUND OF THE INVENTION

The so-called "resist-heating effect" has been observed in electron-beam microlithography with a variable-shaped electron beam. See, e.g., Japanese Laid-Open Patent Document No. Hei 2-143516. The resist-heating effect causes a pattern transferred with a large diameter electron beam to be larger than the same pattern transferred with a smaller diameter electron beam even though the dose is constant. The electron beam irradiating the resist heats the resist, increasing the resist's sensitivity. This effect is most often observed in processes involving direct electron-beam writing of patterns.

In electron-beam writing using a variable-shaped electron beam, the resist-heating effect can be reduced or compensated by changing the exposure time for each of the various beam sizes to achieve a selected dose that produces a corresponding pattern dimension.

While adjusting dose is adequate to compensate the resist-heating effect in direct writing of patterns, dose adjustment is generally impossible in projection or proximity pattern transfer in which patterns are transferred from a mask. A mask pattern used to define a circuit pattern typically contains a mixture of large and small circuit features. When the mask is illuminated, both large and small pattern features are illuminated simultaneously and the dose cannot be optimally selected for both. Under such conditions, the resist-heating effect cannot be eliminated. Accordingly, methods and apparatus for reducing or compensating for the resist-heating effect in CPB pattern transfer from a mask to wafer are needed. There is also a need for such methods and apparatus that avoid the so-called "stencil" or "donut" problem.

SUMMARY OF THE INVENTION

An object of the invention is to provide apparatus and methods for reducing the effects of resist heating in charged-particle-beam (CPB) projection-exposure apparatus and methods, including such apparatus and methods employing a segmented mask or an unsegmented mask (as described in, e.g., U.S. Pat. No. 5,260,151) with a minimal reduction in throughput.

The present invention cures the deficiencies of conventional apparatus and methods summarized above. A circuit pattern is divided into low-resolution (i.e., large) circuit features and high-resolution (i.e., small) circuit features. These features are defined in separate regions or subfields of a mask. This permits selection of the dose to correspond to the feature size. With such pattern division, the resist-heating effect can be reduced or corrected.

According to one aspect of the invention, methods for transferring a pattern to a wafer or other substrate using a CPB are provided. In one representative embodiment, the pattern is divided into low-resolution features and high-resolution features. A low-resolution mask pattern is used to define, on a mask or an area of a mask, the low-resolution features. Similarly, a high-resolution mask pattern is used to define, on a separate mask or a separate region of the same mask, the high-resolution features. Patterns from the low-resolution mask pattern and the high-resolution mask pattern are projected onto the substrate with respective doses.

In any of various embodiments, a circuit pattern can be divided into low-resolution and high-resolution features based on a threshold feature size. By "feature size" is meant a width dimension, or an area of the subject feature, as appropriate.

In another embodiment, a CPB projection-pattern-transfer method is provided in which a pattern to be transferred is divided into a first pattern and a second pattern that are defined as first and second mask patterns in separate areas of a mask. The first pattern includes patterns corresponding to low-resolution features of the pattern to be transferred as well as at least a portion of the patterns for the high-resolution features. The first and second mask patterns are transferred to the wafer by projecting images of the respective patterns with a CPB, producing respective first and second doses at the wafer, wherein the first dose is less than the second dose. At least some areas of the wafer are exposed by both the first and second mask patterns and the dose in such areas is the sum of the first and second doses.

In other embodiments, the pattern to be transferred includes features such as line segments and intersections of line segments. Such a pattern is divided into a first set and second set of features so that the first set of features includes intersections of at least some of the line segments and the second set of features includes at least portions of the line segments. The first and second sets of features are defined by first and second mask patterns, respectively, and transferred to the wafer by projecting images of the mask patterns onto the wafer. The wafer receives first and second doses, corresponding to the first and second mask patterns, respectively, wherein the first dose is less than the second dose. By way of example, the pattern includes rectangular features having sides and corners, and the pattern is divided so that the first set of features includes the corners and the second set of features includes the sides.

According to another aspect of the invention, masks are provided for transferring a pattern to a substrate with a charged-particle beam. The mask comprises first and second areas that define low-resolution and high-resolution features of the pattern, respectively. The low-resolution and high-resolution features can be designated based on a threshold feature size. In one example, the threshold feature size is a width dimension smaller than 0.2 $\mu$m.

A charged-particle-beam projection-pattern-transfer method for transferring a pattern to a wafer or other substrate is provided. The method comprises dividing the pattern into a low-resolution pattern and a high-resolution pattern based on a threshold feature size and defining a first mask pattern that includes the low-resolution pattern and at least a portion of the high-resolution pattern. A second mask pattern is defined to include at least a portion of the high-resolution pattern, and the first and second mask patterns are defined in separate areas on a mask or masks. The first and second mask patterns are transferred to the wafer with respective first and second doses, wherein the first dose is less than the second dose and the second mask pattern is transferred either prior to or after transfer of the first mask pattern.

In yet another embodiment, the portion of the high-resolution pattern defined by the first mask pattern or the portion of the low-resolution pattern defined by the second mask pattern can be selected to avoid the "donut" problem.

In yet another embodiment, the portion of the high-resolution pattern defined by the first and second mask patterns can include a common pattern portion.

According to another aspect of the invention, methods for making a mask for transferring a pattern to a wafer or other substrate by projection-exposure using a charged-particle beam are provided. A representative embodiment of such a method comprises dividing a mask pattern into low-resolution features and high-resolution features and defining such features in respective first and second mask patterns on separate areas of a mask. The patterns can be divided into low-resolution features and high-resolution features based on a threshold feature size.

The foregoing and additional features and advantages of the present invention will be more readily apparent from the following detailed description, which proceeds with reference to the accompanying drawings.

DETAILED DESCRIPTION

Figure 6:
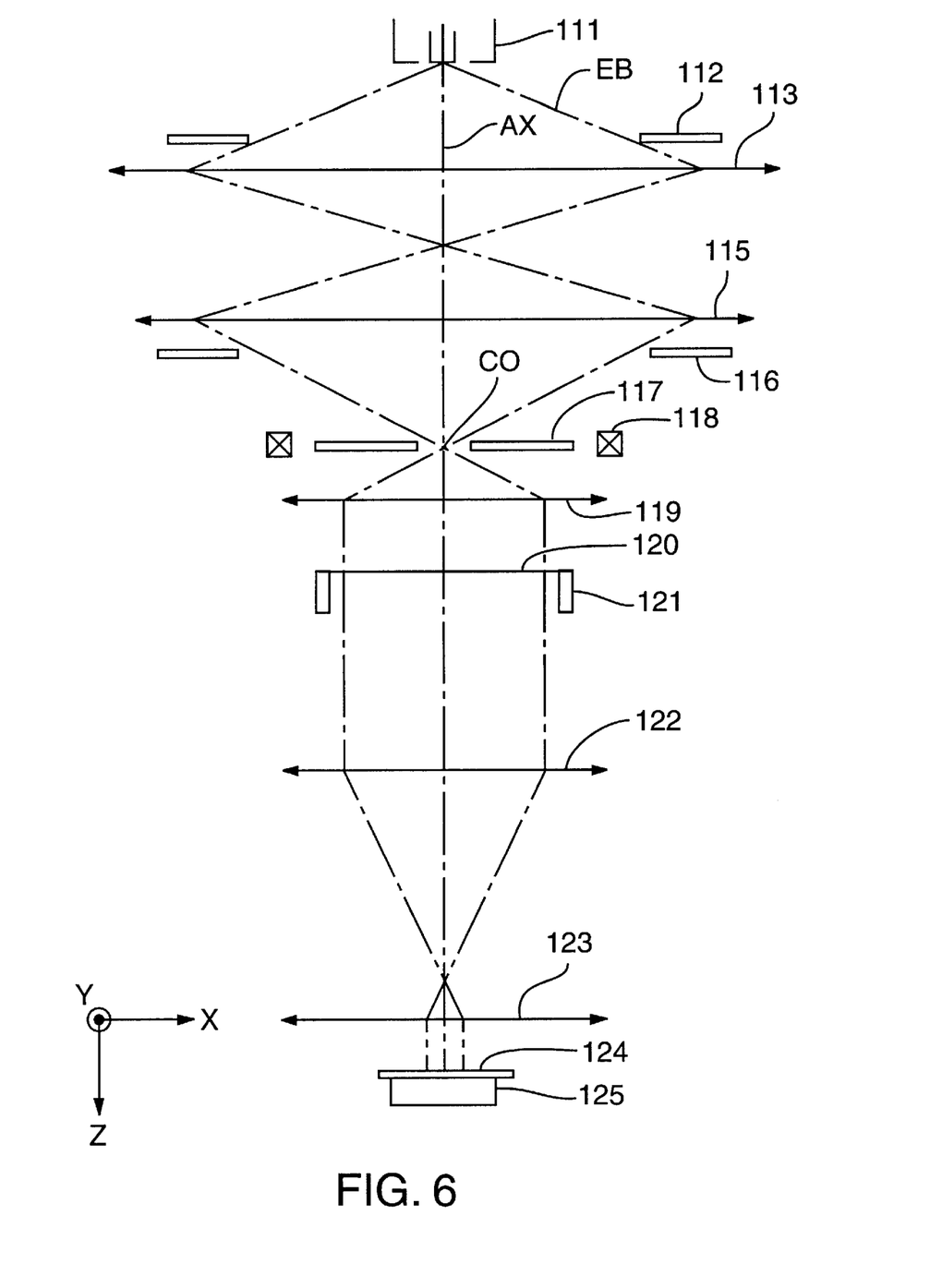
FIG. 6 is a schematic elevational view of certain aspects of a charged-particle-beam pattern-transfer apparatus.

Certain general features, including optical relationships, of a charged-particle-beam (CPB) projection-exposure apparatus according to the invention are shown in FIG. 6. The FIG. 6 apparatus utilizes an electron beam as a representative charged particle beam. An electron gun 111 produces an electron beam EB that propagates in a downstream direction (downward in the figure) along an optical axis AX. Downstream of the electron gun 111 are situated first and second condenser lenses 113, 115, respectively. The electron beam EB passes through the condenser lenses 113, 115 and converges at a "crossover" CO on the optical axis in a blanking aperture 117. The first and second condenser lenses 113, 115 can be operated as a zoom lens to vary the current density of the beam striking a reticle (or mask) 120 located downstream of the blanking aperture 117.

Upstream of the first condenser lens 113 is a first beam-shaping aperture 112 (preferably rectangular or square in profile), and downstream of the second condenser lens 115 is a second beam-shaping aperture 116 (preferably rectangular or square in profile). The beam-shaping apertures 112, 116 serve to appropriately limit the field of view by allowing passage therethrough of a portion of the beam that will illuminate only one exposure unit ("subfield") of the reticle 120. Specifically, for example, the first beam-shaping aperture 112 limits the transverse area of the beam at the reticle 120 to about 1 mm×1 mm. An image of the first beam-shaping aperture 112 is focused onto the second beam-shaping aperture 116 by the first and second condenser lenses 113, 115.

A subfield-selection deflector 118 is situated adjacent the blanking aperture 117 just downstream of the second beam-shaping aperture 116, coaxially with the crossover CO. The subfield-selection deflector 118 scans the electron beam EB in the X direction of FIG. 6 sequentially over adjacent subfields on the reticle to perform sequential exposure of a column of subfields extending in that direction. A condenser lens 119 is situated downstream of the subfield-selection deflector 118 and converts the electron beam, diverging from the crossover CO, into a collimated beam, The condenser lens 119 directs the beam to the reticle 120 on the surface of which an image of the second aperture 116 is focused by the condenser lens 119.

In FIG. 6, only one subfield is shown in axial position on the reticle 120. However, it will be understood that the reticle 120 extends outward from the optical axis AX in the X and Y directions and typically comprises multiple fields and subfields. The subfields can be arranged in units called "stripes" extending in a particular direction X or Y direction. To expose any subfield of the reticle, the electron beam is deflected using the subfield-selection deflector 118. Also, the reticle 120 is mounted on a reticle stage 121 that is movable in the X and Y directions. A wafer 124 or other substrate is mounted on a wafer stage 125 that is movable in the X and Y directions. By scanning the reticle stage 121 and the wafer stage 125 is opposite directions along the Y axis, the subfields within each stripe are sequentially and continuously exposed. To expose the subfields in the next stripe, the stages 121 and 125 are intermittently moved (stepped) in the X direction. The positions of the reticle stage 121 and the wafer stage 125 are accurately measured, preferably using laser interferometers. By separately adjusting each of the deflectors, images of each of the subfields and fields of the mask can be "stitched" together accurately on the surface of the wafer 124.

First and second projection lenses (objective lenses) 122, 123, respectively, and a deflector (not shown) are situated below the reticle 120. The projection lenses 122, 123 receive the portion of the electron beam EB passing through the irradiated reticle subfield and project an image of the irradiated reticle subfield (with appropriate focus and, typically, demagnification) onto a desired location ("transfer subfield") on the wafer 124. The wafer 124 is coated with a suitable resist that imprints the images of the irradiated reticle subfields. As stated above, the wafer 124 is mounted on the wafer stage 125 which can be moved in directions (X and Y directions) orthogonal to the optical axis AX.

The sensitive wafer 124 (or other substrate) is exposed to a CPB using the apparatus of FIG. 6. Generally the wafer 124 is coated with a thin film of a resist that is sensitive to the CPB. Exposure of the wafer 124 to the CPB is conveniently measured as a "dose", i.e., the total charge per unit area received in an exposed region of the wafer 124 and is expressed in units of $\mu C/cm^2$.

In some types of CPB masks, unpatterned areas are defined on the mask with a layer of a CPB scattering or CPB absorbing material while patterned areas are apertures in the scattering or absorbing material. In such masks, the scattering or absorbing material required in an unpatterned area cannot be supported if the unpatterned area is surrounded by patterned areas. This problem is referred to herein as the "stencil" or "donut" problem.

Figure 1A:
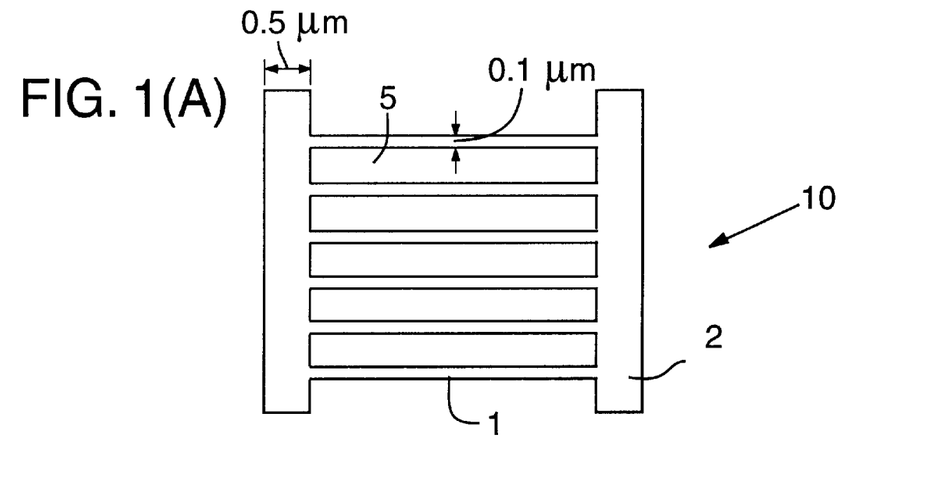
FIG. 1(A) is a schematic view of a first exemplary circuit pattern.
Figure 1B:
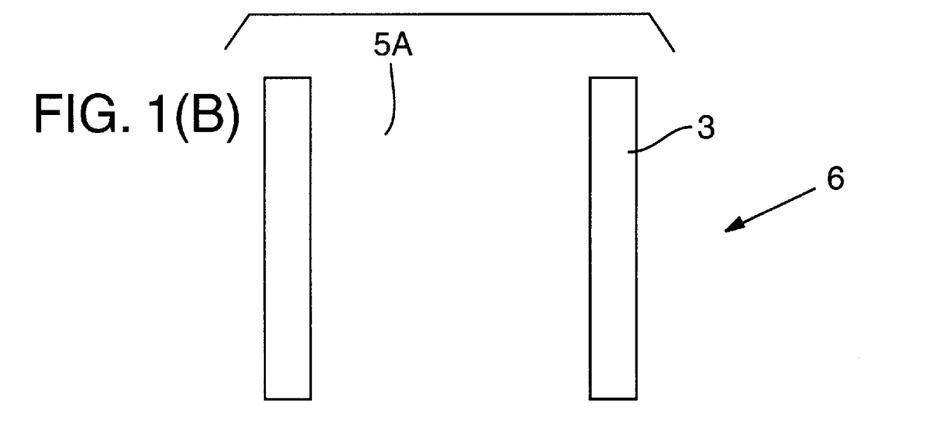
FIGS. 1(B)–1(C) are schematic views illustrating a low-resolution mask pattern and a high-resolution mask pattern, respectively, for the circuit pattern of FIG. 1(A).
Figure 1C:
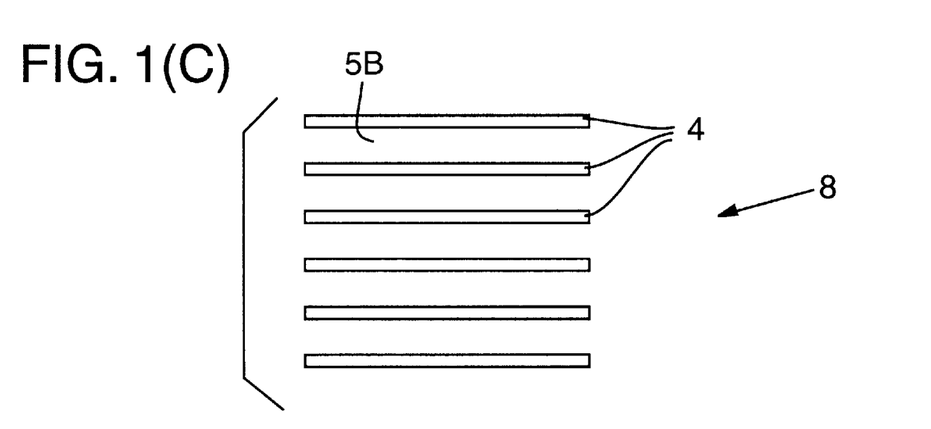

An example of a pattern-dividing method according to a first embodiment of the invention is shown in FIGS. 1(A)–1(C). With reference to FIG. 1(A), an exemplary circuit pattern (or portion thereof) 10 contains low-resolution features 2 (in this example, features larger than 0.2 μm) and high-resolution features 1 (in this example, features smaller than 0.2 mm). The representative threshold feature size of 0.2 μm distinguishes low-resolution and high-resolution circuit features, but larger or smaller threshold feature sizes can alternatively be used. For example, the threshold feature size can be between 0.05 μm and 1.0 μm, or between 0.1 μm and 0.8 μm, or between 0.2 μm and 0.6 μm. The pattern 10 in this example is about 34 μm by 40 μm. As shown in FIG. 1(A), the features 1 have an exemplary width of 0.1 μm and the features 2 have an exemplary width of 0.5 μm. The features 2 comprise two relatively wide and parallel strips extending vertically in the figure, one on the right side and one on the left side. The features 1 comprise six relatively narrow strips extending horizontally in the figure between and connecting together the features 2.

Referring further to FIG. 1(A), the circuit pattern 10 includes unpatterned islands 5 that are completely surrounded by the circuit features 1, 2. If the circuit pattern 10 were defined as shown in FIG. 1(A) with some types of masks, then the islands 5 would be unsupported "donut" regions. Therefore, the circuit pattern 10 is divided in order to avoid the donut problem and to reduce the effects of resist heating.

With reference to FIGS. 1(B)–1(C), the circuit pattern 10 of FIG. 1(A) is defined as a low-resolution mask pattern 6 and a separate high-resolution mask pattern 8 in respective areas of the mask. The exemplary circuit pattern 10 generally represents only a small portion of a complete circuit pattern and many additional circuit patterns can be divided into low-resolution and high-resolution features and defined by respective low-resolution and high-resolution mask patterns. Generally, a circuit pattern that includes both low-resolution and high-resolution features is defined by a low-resolution mask pattern and a high-resolution mask pattern. Such low-resolution and high-resolution mask patterns can be defined in respective regions (which can be subfields) of a mask or on separate masks. Note the mask patterns 6, 8 are needed to complete the circuit pattern 10 and the mask patterns 6, 8 are transferred onto the same substrate region. In contrast, in CPB pattern-transfer using a conventional segmented mask, each mask subfield is projected onto a separate respective region on the substrate and the exposed regions are stitched together on the substrate along their boundaries.

With reference to FIG. 1(B), the low-resolution mask pattern 6 defines low-resolution circuit features such as the features 3 corresponding to the circuit features 2 in FIG. 1(A). The mask pattern 6 is used to expose a wafer at a dose of, e.g., 2 μC/cm². With reference to FIG. 1(C), the high-resolution mask pattern 8 defines high-resolution circuit features such as the features 4 that correspond to the circuit features 1 in FIG. 1(A). The mask pattern 8 is used to expose the wafer at a dose of, e.g., 5 μC/cm².

The islands 5 of FIG. 1(A) correspond to areas 5A, 5B on the respective mask patterns 6, 8. Referring to FIGS. 1(B)–1(C), it is apparent that the stencil or donut problem is eliminated by this pattern division.

In a conventional pattern-transfer method, the circuit pattern 10 is transferred to a wafer in a single exposure or "shot" (if an appropriate mask can be made). However, conventional exposure does not solve the resist-heating problem and circuit features of different sizes are not transferred to the wafer in a single shot without changing their relative sizes, even though the dose (in μC/cm²) is constant. According to the first embodiment, in contrast, the wafer is exposed in a first shot with the low-resolution mask pattern 6 at a dose of, e.g., 2 μ/cm² and in a second shot with the high-resolution mask pattern 8 at a dose of, e.g., 5 μC/cm². Thus, two shots transfer the complete circuit pattern 10 and high-resolution and low-resolution circuit features are exposed at different doses. The mask patterns 6, 8 can be conveniently defined in separate regions of a single mask or on different masks. The order of exposure can be arbitrary, i.e., the wafer can be exposed with either of the mask patterns 6, 8 first, followed by exposure with the remaining mask pattern.

For each of the mask patterns 6, 8, the length of exposure using a particular intensity of the electron beam can be adjustable to achieve a selected dose. For example, in this embodiment, the electron-beam dose used to projection-transfer the pattern portions 3 shown in FIG. 1(B) is 2 μC/cm², and the electron-beam dose used to projection-transfer the mask pattern 8 shown in FIG. 1(C) is 5 μC/cm², but these doses are independently selectable. Thus, each of the mask patterns 6, 8 is transferred with high accuracy onto the wafer.

Figure 2A:
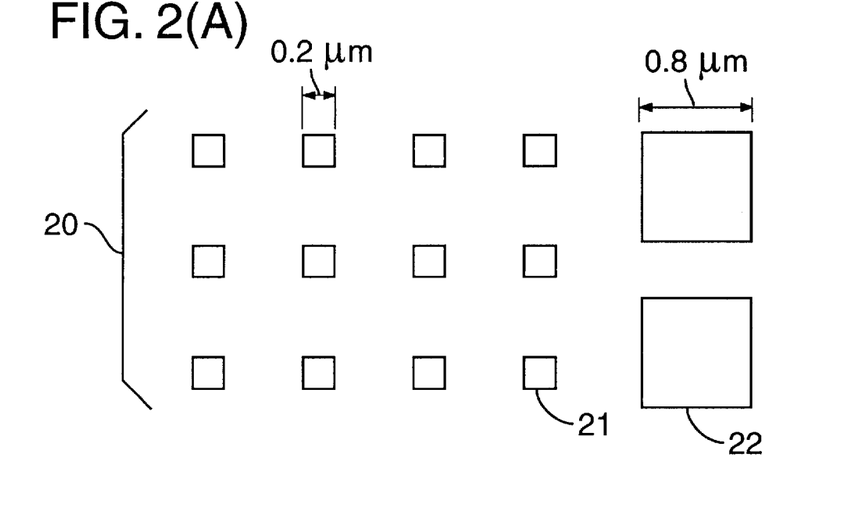
FIG. 2(A) is a schematic view of a second exemplary circuit pattern.
Figure 2B:
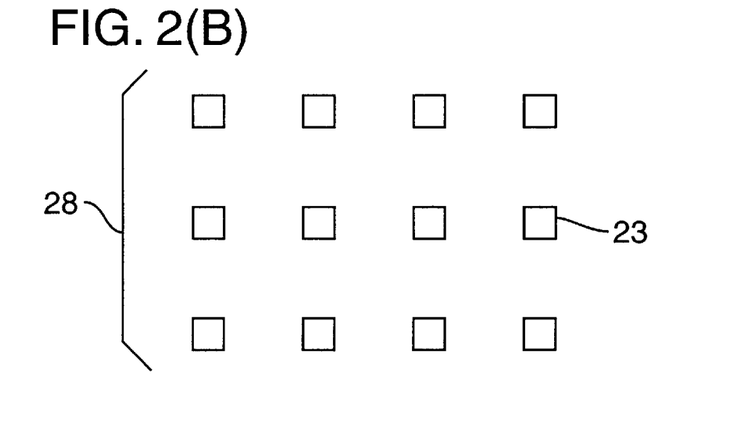
FIGS. 2(B)–2(C) are schematic views illustrating a low-resolution mask pattern and a high-resolution mask pattern, respectively, for the circuit pattern of FIG. 2(A).
Figure 2C:
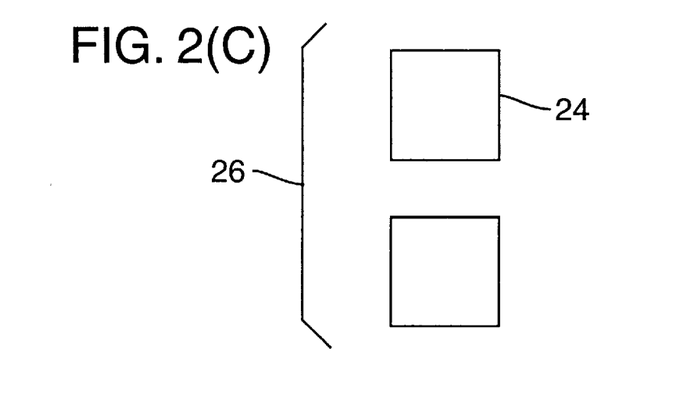

An example of a pattern-dividing method according to a second embodiment of the invention is shown in FIGS. 2(A)–2(C). With reference to FIG. 2(A), a circuit pattern 20 comprises low-resolution and high-resolution circuit features 21, 22. The circuit features 21 are approximately 0.2-μm square and the circuit features 22 are approximately 0.8-μm square. The threshold feature size for dividing circuit features into low-resolution and high-resolution features is, by way of example, 0.2 μm. The circuit pattern 20 contains features similar to those used for contact holes and bonding pads.

With reference to FIG. 2(B), a high-resolution mask pattern 28 includes features 23 corresponding to the high-resolution circuit features 21. With reference to FIG. 2(C), a low-resolution mask pattern 26 includes features 24 corresponding to the low-resolution circuit features 22.

In this second embodiment, the resist-heating effect is substantially corrected by exposing the wafer so that the circuit features defined by the mask patterns 26, 28 receive different exposures. For example, circuit features defined by the mask pattern 28 (for example, the features 23 corresponding to the high-resolution features 21) receive a 10 μC/cm² dose. Circuit features defined by the low-resolution mask pattern 26 (for example, the features 24 corresponding to the low-resolution features 22) receive a 2 μC/cm² dose. Thus, low-resolution and high-resolution circuit features receive different doses, and exposure can be selected as appropriate in consideration of the size of the circuit features.

Figure 3A:
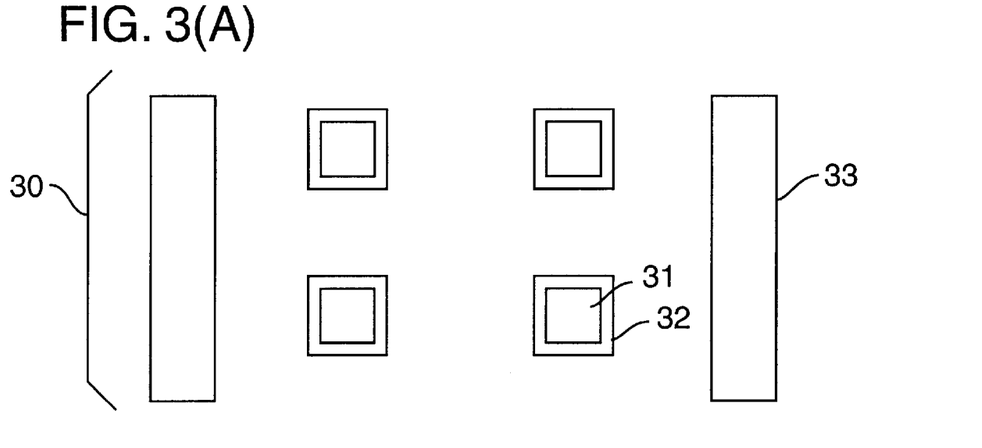
FIG. 3(A) is a schematic view of a third exemplary circuit pattern.
Figure 3B:
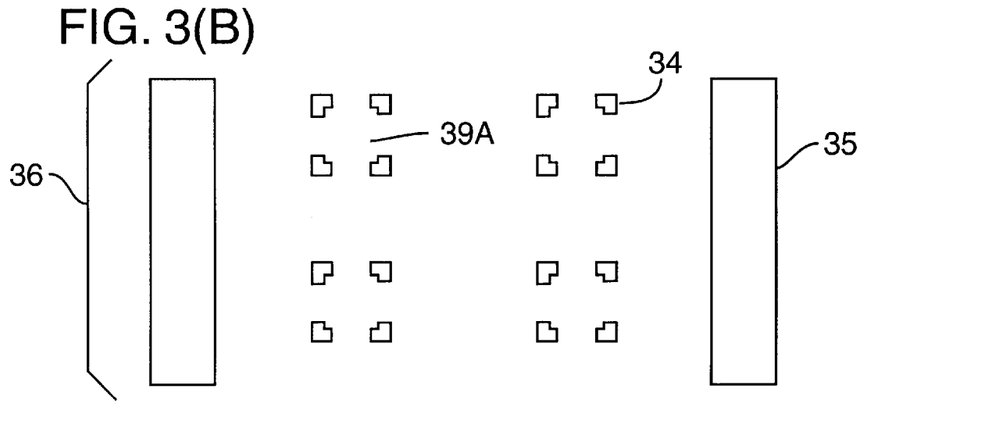
FIGS. 3(B)–3(C) are schematic views illustrating a division of the circuit pattern into separate mask patterns.
Figure 3C:
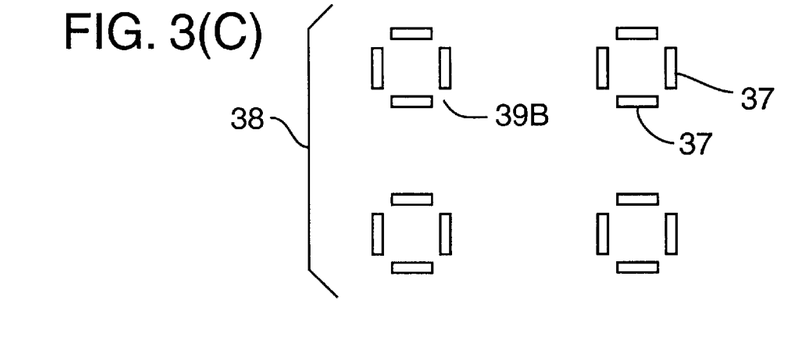

An example of a pattern-dividing method according to a third embodiment of the invention is shown in FIGS. 3(A)–3(C). With reference to FIG. 3(A), an exemplary circuit pattern 30 includes circuit features 32, 33. The circuit features 32 are annular regions that completely surround corresponding island areas 31. The width of the circuit features 32 is relatively narrow and greater patterning accuracy is usually required in the sides than in the corners 34. FIG. 3(B) depicts features 35 corresponding to the circuit features 33 and features 34 corresponding to respective corners of the circuit features 32.

Referring to FIG. 3(B), a first mask pattern 36 includes the features 35 corresponding to the low-resolution circuit features 33 in FIG. 3(A) and the corners 34 corresponding to respective corners of the annular (high-resolution) circuit features 32 in FIG. 3(A). Thus, the first mask pattern 36 includes patterns for low-resolution circuit features as well as some high-resolution features. The wafer is exposed with the mask pattern 36 at a relatively low dose (e.g., $2\,\mu C/cm^2$).

With reference to FIG. 3(C), a high-resolution mask pattern 38 includes features 37 corresponding to the sides of the circuit features 32. The circuit features 32 are higher-resolution features than the circuit features 33. The wafer is exposed with the mask pattern 38 at a relatively high dose (e.g., $5\,\mu m/cm^2$). With the pattern-division shown in FIGS. 3(B)–3(C), the circuit pattern 30 is divided so to avoid the stencil or donut problem as well as to reduce the resist-heating effect.

By dividing the pattern 30 as illustrated in FIGS. 3(B)–3(C), the islands 31 are not islands as defined by either of the mask patterns 36, 38. As shown in FIG. 3(A), if the circuit pattern 30 is defined by a conventional mask, then the islands 31 would be unsupported. With the pattern division of FIGS. 3(B), FIG. 3(C), the islands 31 are supported via the mask areas 39A, 39B, respectively. In addition, the circuit pattern 30 is divided into lower-resolution and higher-resolution portions so that the resist-heating effect is reduced.

Figure 4A:
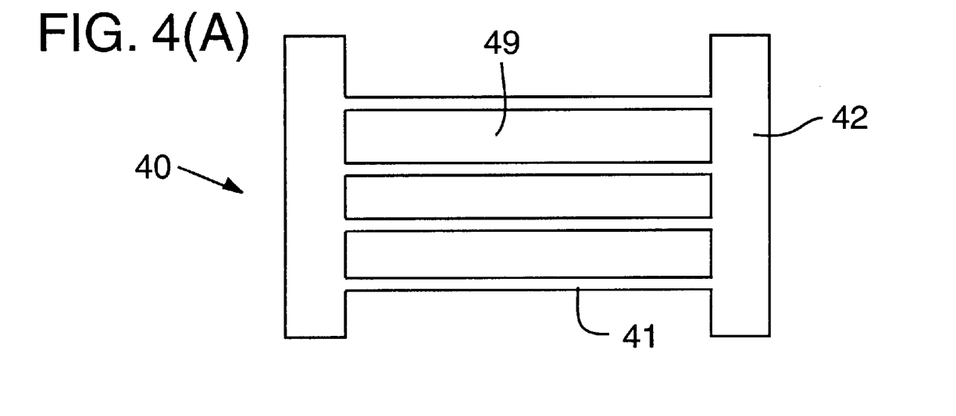
FIG. 4 is a schematic view of a fourth exemplary circuit pattern.
Figure 4B:
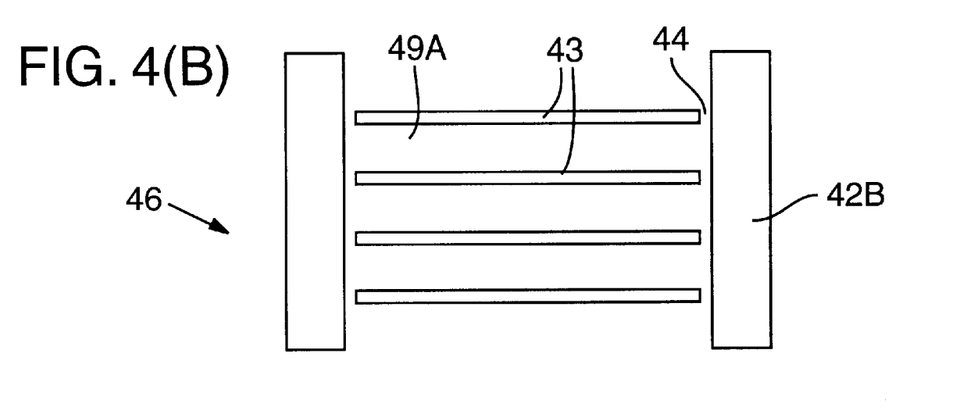
FIGS. 4(B)–4(C) are schematic views illustrating a division of the circuit pattern into separate mask patterns.
Figure 4C:
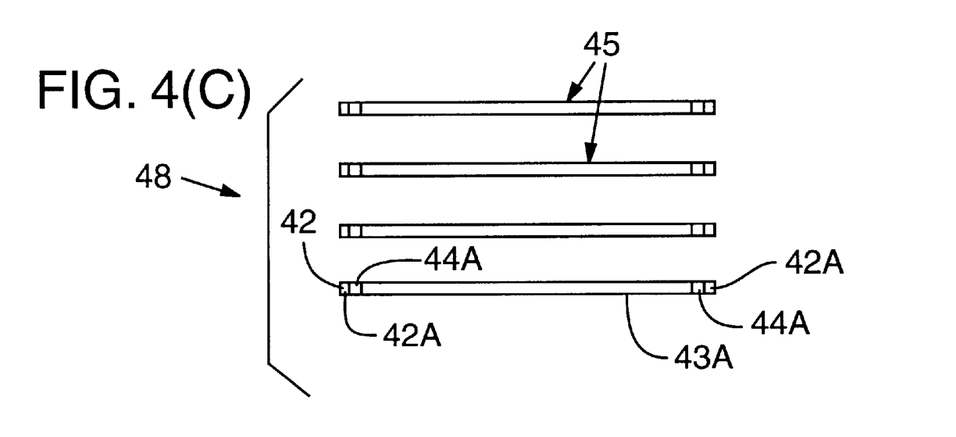

An example of a pattern-dividing method according to a fourth embodiment of the invention is shown in FIGS. 4(A)–4(C). In the fourth embodiment, the circuit pattern 40 is defined on a mask to avoid the stencil (donut) problem as well as reduce the resist-heating effect. In addition, throughput is increased. With reference to FIG. 4(A), a circuit pattern 40 includes circuit features 41, 42 and islands 49 that are surrounded by the circuit features 41, 42. The circuit features 42 are low-resolution features and the circuit features 41 are high-resolution features.

With reference to FIG. 4(B), a first mask pattern 46 includes features 42B corresponding to the features 42 in FIG. 4(A) and features 43 corresponding to the features 41 in FIG. 4(A). The areas 49A correspond to the islands 49. The areas 49A are not completely surrounded by the features 42B, 43 and hence are not islands. Because the mask pattern 46 includes the relatively low-resolution features 42B, the wafer is exposed with the mask pattern 46 at a relatively low dose of, e.g., $2\,\mu C/cm^2$. The high-resolution circuit features 41 are partially defined by the features 43 and exposure at this low dose produces corresponding features on the mask that are smaller than achieved in the absence of the resist-heating effect. Therefore, wafer features corresponding to the circuit features 41 are too small after exposure only with the mask pattern 46. In addition, wafer areas corresponding to the gaps 44 are not exposed with the mask pattern 46.

With reference to FIG. 4(C), a second mask pattern 48 includes features 45 corresponding to the high-resolution circuit features 41 in FIG. 4(A). The features 45 include portions 43A that overlap the features 43 as transferred to the wafer, portions 42A that overlap the features 42, and regions 44A corresponding to the gaps 44. Exposure of the wafer with the mask pattern 48, in conjunction with exposure with the mask pattern 46, produces corresponding features on the wafer that are correctly sized. The mask pattern 48 includes patterns defining high-resolution circuit features (such as the features 41). Exposure of the wafer with the mask pattern 48 is performed to achieve a dose selected for accurate transfer of such high-resolution features. Thus, the narrowing of small circuit features caused by the resist-heating effect is avoided.

The mask pattern 46 of FIG. 4(B) is exposed at a dose of, e.g., $2\,\mu C/cm^2$; the mask pattern of FIG. 4(C) is exposed at a dose of, e.g., $3\,\mu C/cm^2$. Thus, some wafer areas corresponding to the circuit features 41 are exposed with the mask patterns 46, 48 and receive a total dose of $5\,\mu C/cm^2$. The double-exposed portions 42A avoid the formation of a narrow connection between the features 41 and 42.

The circuit pattern 40 of FIG. 4(A) is the same as the circuit pattern 10 of FIG. 1(A). However, the pattern-division of the fourth embodiment not only reduces the effects of resist heating and eliminates the stencil problem, but also achieves higher throughput. In the first embodiment, two exposures are necessary: an exposure of the low-resolution mask pattern 6 at a dose of, e.g., $2\,\mu C/cm^2$ and an exposure of the high-resolution mask pattern 8 at a dose of, e.g., $5\,\mu C/cm^2$. In the fourth embodiment, respective exposures of $2\,\mu C/cm^2$ and $3\,\mu C/cm^2$ are used. Because the total dose is less in the fourth embodiment compared to the first embodiment, the total exposure time required is less and throughput is higher.

Figure 5A:
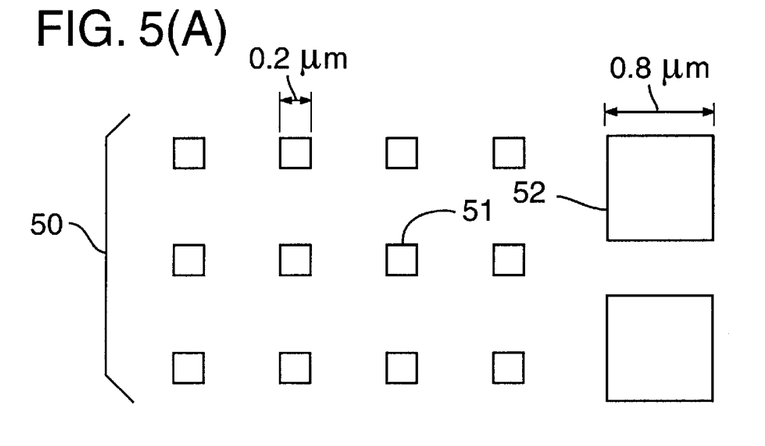
FIG. 5(A) is a schematic view of a fifth exemplary circuit pattern.
Figure 5B:
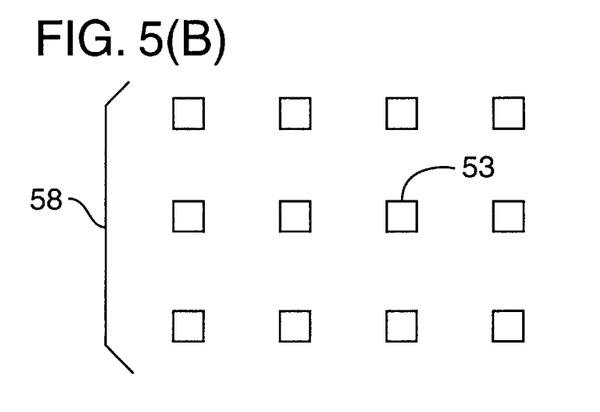
FIGS 5(B)–5(C) are schematic views illustrating a high-resolution mask pattern and a combined high-resolution and low-resolution mask pattern, respectively, for the circuit pattern of FIG. 5(A).
Figure 5C:
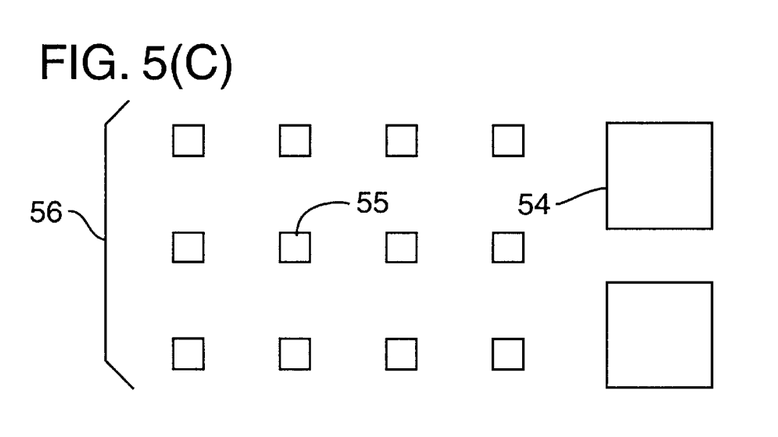

An example of a pattern dividing method according to a fifth embodiment of the invention is shown in FIGS. 5(A)–5(C). With reference to FIG. 5(A), a circuit pattern 50 comprises high-resolution and low-resolution circuit features 51, 52, respectively. The circuit features 51 are approximately $0.2\text{-}\mu m$ square and the circuit features 52 are approximately $0.8\text{-}\mu m$ square.

With reference to FIG. 5(B), a high-resolution mask pattern 58 includes features 53 corresponding to the high-resolution circuit features 51. With reference to FIG. 2(C), a mask pattern 56 includes features 54 corresponding to the low-resolution circuit features 52 and features 55 corresponding to the high-resolution circuit features 51. The mask pattern 56 comprises features for both high- and low-resolution circuit features.

In the fifth embodiment, a wafer is exposed with a $2\,\mu C/cm^2$ dose with the mask pattern 56 (the combined high-resolution/low-resolution mask pattern) and exposed by the mask pattern 58 with a $3\,\mu C/cm^2$ dose. Therefore, the low-resolution circuit features 52 receive a dose of $2\,\mu C/cm^2$ while the high-resolution circuit features 51 receive a $5\,\mu C/cm^2$ dose. Therefore, the resist-heating effect is corrected and pattern-transfer throughput is increased.

Therefore, the pattern-division and CPB pattern-transfer methods and masks of the example embodiments reduce the effects of resist-heating in CPB pattern-transfer and avoid the stencil problem.

Whereas the invention has been described in connection with several example embodiments, it will be understood that the invention is not limited to these embodiments. On the contrary, the invention is intended to encompass all alternatives, modifications, and equivalents as may be included within the spirit and scope of the invention as defined by the appended claims.

What is claimed is:

1. A charged-particle-beam pattern-transfer method for transferring a pattern to a wafer or other substrate, comprising:

(a) dividing the pattern into a low-resolution pattern and a high-resolution pattern based on a threshold feature size of the pattern;

(b) defining the low-resolution and high-resolution patterns in separate subfields of a mask;

(c) projecting subfields defining the low-resolution pattern onto the substrate using a charged particle beam at a first dose; and (d) projecting subfields defining the high-resolution pattern onto the substrate using the charged particle beam at a second dose that is higher than the first dose.

2. The method of claim 1, wherein at least one subfield defines a donut pattern.

3. The method of claim 2, wherein the subfields are projected so as to define the pattern.

4. A charged-particle-beam pattern-transfer method for transferring a pattern from a mask to a wafer or other substrate, comprising:

(a) dividing the pattern into a first set of features and second set of features;

(b) defining a first mask pattern including patterns for the first set of features and patterns for at least a portion of the second set of features;

(c) defining a second mask pattern including patterns for at least a portion of the second set of features; and (d) projecting patterns from the first and second mask patterns to the substrate using a CPB.

5. The method of claim 4, wherein, in step(d), at least a portion of the substrate is exposed by both the first and second mask patterns.

6. The method of claim 4, wherein projecting the first and second mask patterns onto the substrate transfers the pattern to the substrate.

7. The method of claim 4, further comprising selecting a threshold feature size, wherein the first set of features includes features larger than the threshold feature size and the second set of features includes features smaller that the threshold feature size.

8. The method of claim 4, wherein the pattern includes line segments and intersections of line segments, and the pattern is divided so that the first set of features includes intersections of at least some of the line segments and the second set of features includes at least portions of the line segments.

9. The method of claim 8, wherein the pattern includes polygonal features having sides and corners, and wherein the pattern is divided so that the first set of features includes the corners and the second set of features includes the sides.

10. The method of claim 9, wherein the features are rectangular or square.

11. The method of claim 4, wherein the first and second mask patterns are defined as different regions of a mask.

12. The method of claim 4, wherein the first and second mask patterns are defined in respective separate masks.

13. A charged-particle-beam pattern-transfer method for transferring a pattern from a mask or masks to a wafer or other substrate, comprising:

(a) dividing the pattern for each subfield into a low-resolution pattern and a high-resolution pattern based on a threshold feature size;

(b) defining a first mask pattern for each subfield to the low-resolution and at least a portion of the high-resolution pattern;

(c) defining a second mask pattern for each subfield to include at least a portion of the high-resolution pattern, wherein the first and second mask patterns are defined in separate areas on a mask or masks;

(d) projecting the subfields corresponding to the first mask pattern onto the substrate with a CPB at a first dose; and (e) projecting the subfields corresponding to the second mask pattern onto the substrate with a CPB at a second dose, wherein the subfields corresponding to the second mask pattern are transferred either before or after transfer of the subfields corresponding to the first mask pattern.

14. The method of claim 13, further comprising selecting the portion of the high-resolution pattern defined by the first mask pattern to avoid the donut problem.

15. The method of claim 14, further comprising selecting the portion of the high-resolution pattern defined by the second mask pattern to avoid the donut problem.

16. The method of claim 13, further comprising selecting the portion of the high-resolution pattern defined by the second mask pattern to avoid the donut problem.

17. The method of claim 13, wherein the portions of the high-resolution pattern defined by the first and second mask patterns include a common pattern portion.

18. A charged-particle-beam pattern-transfer method for transferring a pattern to a wafer or other substrate, comprising:

(a) dividing the pattern into a low-resolution pattern and a high-resolution pattern based on a threshold feature size;

(b) defining a first mask pattern in a first mask subfield, the first mask pattern including the low-resolution pattern and at least a portion of the high-resolution pattern;

(c) defining a second mask pattern in a second mask subfield, the second mask subfield including at least a portion of the high-resolution pattern, wherein the first and second mask patterns are defined in separate areas on a mask;

(d) projecting the first and the second mask patterns from the respective mask subfields onto a transfer subfield of the substrate with a charged-particle beam at respective doses, wherein a dose corresponding to the low-resolution pattern is less than a dose corresponding to the high-resolution pattern, and the second mask pattern is transferred either before or after transfer of the first mask pattern.

19. The method of claim 18, further comprising selecting the portion of the high-resolution pattern defined by the first mask pattern to avoid a donut problem.

20. The method of claim 18, further comprising selecting the portion of the high-resolution pattern defined by the second mask pattern to avoid a donut problem.

* * * * *